(12) United States Patent
Arora et al.

(10) Patent No.: US 11,049,794 B2
(45) Date of Patent: Jun. 29, 2021

(54) CIRCUIT BOARD WITH PHASE CHANGE MATERIAL

(71) Applicant: ADVANCED MICRO DEVICES, INC., Santa Clara, CA (US)

(72) Inventors: Manish Arora, Dublin, CA (US); Nuwan Jayasena, Sunnyvale, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 1355 days.

(21) Appl. No.: 14/194,701

(22) Filed: Mar. 1, 2014

(65) Prior Publication Data

US 2015/0249044 A1   Sep. 3, 2015

(51) Int. Cl.
| | |
|---|---|
| *H01L 23/373* | (2006.01) |
| *H01L 23/427* | (2006.01) |
| *H05K 1/02* | (2006.01) |
| *H01L 23/00* | (2006.01) |
| *H05K 3/46* | (2006.01) |
| *H05K 3/34* | (2006.01) |

(52) U.S. Cl.
CPC ....... *H01L 23/4275* (2013.01); *H05K 1/0203* (2013.01); *H01L 24/13* (2013.01); *H01L 24/16* (2013.01); *H01L 2224/131* (2013.01); *H01L 2224/16225* (2013.01); *H01L 2924/15192* (2013.01); *H01L 2924/15311* (2013.01); *H01L 2924/15312* (2013.01); *H01L 2924/15313* (2013.01); *H01L 2924/19041* (2013.01); *H01L 2924/19042* (2013.01); *H01L 2924/19043* (2013.01); *H01L 2924/19105* (2013.01); *H05K 3/3436* (2013.01); *H05K 3/4697* (2013.01)

(58) Field of Classification Search
CPC ... H01L 23/373; H01L 21/4882; G06Q 50/06; H05K 7/2029; H05K 7/20363; H05K 7/20481; H05K 7/205
See application file for complete search history.

(56) References Cited

U.S. PATENT DOCUMENTS

| | | | |
|---|---|---|---|
| 6,353,208 B1 * | 3/2002 | Bostic | A47J 47/145 126/400 |
| 6,489,237 B1 * | 12/2002 | Wu | H01L 21/0337 257/E21.038 |
| 30,153,667 | 8/2003 | Jayaraman et al. | |
| 6,724,626 B1 | 4/2004 | Hodes et al. | |
| 7,170,000 B2 | 1/2007 | Maeda et al. | |
| 7,528,502 B2 | 5/2009 | Maeda | |
| 90,301,691 | 12/2009 | Mohapatra | |
| 9,285,109 B1 * | 3/2016 | Olsson | F21V 31/005 |
| 2002/0033247 A1 * | 3/2002 | Neuschutz | F28D 20/02 165/10 |
| 2008/0141681 A1 * | 6/2008 | Arnold | A41D 13/005 62/3.5 |

(Continued)

OTHER PUBLICATIONS

U.S. Appl. No. 14/016,063, filed Aug. 31, 2013, Arora et al.

(Continued)

*Primary Examiner* — Huy Q Phan
*Assistant Examiner* — Adam S Clarke

(57) ABSTRACT

Various circuit board embodiments are disclosed. In one aspect, an apparatus is provided that includes a circuit board and a first phase change material pocket positioned on or in the circuit board and contacting a surface of the circuit board.

19 Claims, 9 Drawing Sheets

(56) References Cited

U.S. PATENT DOCUMENTS

| | | | | |
|---|---|---|---|---|
| 2009/0121135 | A1* | 5/2009 | Warner | G02B 23/125 |
| | | | | 250/330 |
| 2010/0059878 | A1 | 3/2010 | Crane et al. | |
| 2011/0176280 | A1 | 7/2011 | Lee | |
| 2012/0280382 | A1* | 11/2012 | Im | H01L 23/3128 |
| | | | | 257/712 |
| 2012/0285371 | A1* | 11/2012 | Lee | C30B 25/18 |
| | | | | 117/104 |
| 2013/0308279 | A1* | 11/2013 | Kim | H01L 23/373 |
| | | | | 361/720 |
| 2014/0043769 | A1* | 2/2014 | Chang | H05K 7/2039 |
| | | | | 361/720 |
| 2014/0268572 | A1* | 9/2014 | Ranjan | H05K 7/20336 |
| | | | | 361/700 |
| 2014/0369005 | A1* | 12/2014 | Gavillet | H01L 23/373 |
| | | | | 361/699 |
| 2015/0037646 | A1* | 2/2015 | Wyatt | H01M 10/6551 |
| | | | | 429/120 |
| 2015/0043161 | A1* | 2/2015 | Nelson | G06F 1/203 |
| | | | | 361/679.54 |
| 2015/0136360 | A1* | 5/2015 | Xu | F28D 9/0087 |
| | | | | 165/84 |
| 2015/0232266 | A1* | 8/2015 | Ahmed | B65D 88/744 |
| | | | | 220/592.01 |

OTHER PUBLICATIONS

U.S. Appl. No. 14/218,801, filed Mar. 18, 2014, Arora et al.
Wikipedia; *Computer Cooling;* http://en.wikipedia.org/wiki/Computer_cooling; Dec. 13, 2012; pp. 1-16.
Wikipedia; *Phase-change Material;* http://en.wikipedia.org/wiki/Phase-change_material; Dec. 13, 2012; pp. 1-16.
Arun Raghavan et al.; *Computational Sprinting;* In the Proceedings of the 18$^{th}$ Symposium on High Performance Computer Architecture (HPCA 2012); 2012; pp. 1-12.
USPTO Office Action notification date Mar. 2, 2015; U.S. Appl. No. 14/016,063.
USPTO Office Action notification date Sep. 4, 2014; U.S. Appl. No. 14/016,063.
Midel; *Dielectric Insulating Fluid Overview;* www.midel.com; Dec. 2010; pp. 1-2.
Midel; *Natural Ester Dielectric Insulating Fluid Overview;* www.midel.com; Mar. 2014; pp. 1-2.
USPTO Office Action notification date Nov. 19, 2015; U.S. Appl. No. 14/218,801.

* cited by examiner

CIRCUIT BOARD WITH PHASE CHANGE MATERIAL

BACKGROUND OF THE INVENTION

1. Field of the Invention

This invention relates generally to electronic devices, and more particularly to structures and methods for providing thermal management of electronic devices, including circuit boards.

2. Description of the Related Art

Circuit boards, such as printed circuit boards, are used in a vast array of electronic devices. Examples of such devices are legion, and include devices as diverse as walkie talkies and numerically controlled lathes. A typical conventional circuit board includes a substrate upon which several components are mounted. The components can include integrated circuits, and passive devices such as capacitors, resistors and inductors. In some applications, the circuit board itself or one or more components mounted thereon may dissipate sufficient amounts of heat that thermal management may be necessary. This may be due to the potential for the undissipated heat to adversely affect the performance or damage components of the device and/or for the heat to cause the temperature of the device in question to climb above a comfortable level for user handling.

Heat sinks have been used for many years to dissipate heat generated by circuit board components. Conventional heat sinks are manufactured in a large variety of shapes and sizes. Many include multiple heat fins projecting from a base member. Others include heat pipes. Copper and aluminum are common conventional heat sink materials due to their favorable conductive heat transfer characteristics.

Conventional heat sinks have the disadvantage of consuming space. In systems with large internal spaces, such as desktop computers with large cases, big heat sinks may be easily accommodated. Thin devices, such as tablet computers, represent a bigger technical challenge, since internal space in such devices is limited. Some designers have turned to flattened heat sinks for confined spaces. However, conventional flattened heat sinks may give way to the continuing drive to shave millimeters off the thicknesses of computing devices.

The present invention is directed to overcoming or reducing the effects of one or more of the foregoing disadvantages.

SUMMARY OF THE INVENTION

In accordance with one aspect of the present invention, an apparatus is provided that includes a circuit board and a first phase change material pocket positioned on or in the circuit board and contacting a surface of the circuit board.

In accordance with another aspect of the present invention, a method of manufacturing is provided that includes providing a circuit board and positioning a first phase change material pocket on or in the circuit board to contact a surface of the circuit board.

In accordance with another aspect of the present invention, a method of providing thermal management for a component mounted on a circuit board is provided. The method includes positioning a first phase change material pocket on or in the circuit board. Thermal contact between the phase change material pocket and the component is established.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various circuit board arrangements are disclosed. The disclosed embodiments incorporate one or more phase change material pockets on or in a circuit board. The phase change material readily absorbs and stores heat during phase change and thus facilitates heat management for the circuit board and/or components mounted thereon. Additional details will now be described.

Figure 1:
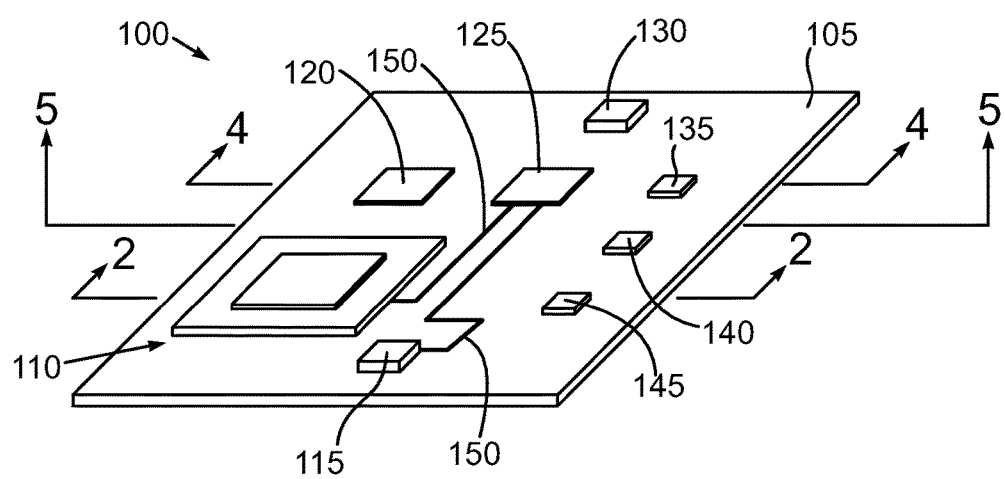
FIG. 1 is a pictorial view of an exemplary embodiment of a semiconductor chip device 100 that includes a circuit board and plural components.

In the drawings described below, reference numerals are generally repeated where identical elements appear in more than one figure. Turning now to the drawings, and in particular to FIG. 1, therein is shown a pictorial view of an exemplary embodiment of a semiconductor chip device 100 that includes a circuit board 105 upon which plural components may be mounted. A few of these components are illustrated and labeled 110, 115, 120, 125, 130, 135, 140 and 145 respectively. The components 110, 115, 120, 125, 130, 135, 140 and 145 may be virtually any type of electronic or electric component that may be mounted to a circuit board. Examples include packaged semiconductor chips, optical devices such as lasers, passive components such as inductors, capacitors and resistors, etc., or other devices. The types of semiconductor chips are legion and include processors, optical devices, communications chips, system-on-chips or virtually any other type of electronic functionality. The circuit board 105 may be a laminate construction consisting of plural layers that are brought together either in a sandwich fashion or as build up layers on a central core. The circuit board 105 may include multitudes of internal and external conductor traces. A few exemplary surface traces are depicted and labeled collectively 150. Here, the circuit board 105 has a generally rectangular form factor or footprint. However, the skilled artisan will appreciate that the circuit board 105 may have virtually any footprint.

Although not visible in FIG. 1, the circuit board 105 may be provided with one or more PCM pockets that are designed to provide thermal management for one or more of the components 110, 115, 120, 125, 130, 135, 140 and 145. Additional details of some of these PCM pockets may be understood by referring now also to FIG. 2, which is a sectional view of FIG. 1 taken at section 2-2. Note that because of the location of section 2-2, the component 110 and the component 145 will appear in section. Here, the component 110 may consist of a packaged semiconductor chip 155 that is mounted on a package substrate 160. The semiconductor chip 155 may interface electrically with the package substrate 160 in a variety of ways. In this illustrative embodiment, a plurality of solder joints 165 such as solder bumps, microbumps or conductive pillars may be used to interface the chip 155 with the package substrate 160. The package substrate 160, may, in turn, electrically interface with the circuit board 105 by way of the depicted ball grid array 170. Optionally, a myriad of other types of interface schemes, such as, pin grid arrays, land grid arrays, conductive pillars, lead frames, etc. may be used to interface the substrate 160 with the circuit board 105. To provide thermal management for the component 110, the circuit board 105 may be provided with a PCM pocket 175 positioned in the circuit board 105 beneath the location of the component 110. As discussed elsewhere, there may be more than one PCM pocket 175 associated with the circuit board 105, and a PCM pocket may be positioned on or in the circuit board 105.

A PCM pocket, such as the PCM pocket 175, includes a volume of a PCM that will readily absorb and store heat while undergoing a change of physical phase, say from solid to liquid or from one solid phase to another. The heat can be released later during periods of reduced power consumption by one or all of the structures of the circuit board 105. The PCM pocket 175 and any alternatives thereof may be so-called solid-to-liquid phase materials or solid phase-to-solid phase materials. A large variety of different types of PCMs may be used. In general, there are three varieties of PCMs: (1) organic; (2) inorganic; and (3) eutectic. These categories may be further subdivided as follows:

TABLE 1

| PCM MATERIAL CLASSIFICATION | | |
|---|---|---|
| ORGANIC | INORGANIC | EUTECTIC |
| Paraffin | Salt Hydrate | Organic-Organic |
| Non-Paraffin | Metallic | Inorganic-Inorganic |
| | | Inorganic-Organic |

A variety of characteristics are desirable for the material(s) selected for the PCM pocket(s) 175 and any alternatives. A non-exhaustive list of the types of desired PCM characteristics includes a melting temperature $T_m$ less than but close to the maximum anticipated chip operating temperature $T_{max}$, a high latent heat of fusion, a high specific heat, a high thermal conductivity, small volume change and congruent melting (for solid-to-liquid), high nucleation rate to avoid supercooling, chemical stability, low or non-corrosive, low or no toxicity, nonflammability, nonexplosive and low cost/high availability. Some of these characteristics may be favored over others for a given PCM. Table 2 below illustrates some exemplary materials for the PCM pocket(s) 175 and any alternatives.

TABLE 2

| Material | Melting Point $T_m$ (° C.) | Latent Heat of Fusion (kJ/kg) | Notes |
|---|---|---|---|
| Paraffin | | | The numbers in the first column represent the number of carbon atoms for a given form of paraffin |
| 21 | 40.2 | 200 | |
| 22 | 44.0 | 249 | |
| 23 | 47.5 | 232 | |
| 24 | 50.6 | 255 | |
| 25 | 49.4 | 238 | |
| 26 | 56.3 | 256 | |
| 27 | 58.8 | 236 | |
| 28 | 61.6 | 253 | |
| 29 | 63.4 | 240 | |
| 30 | 65.4 | 251 | |
| 31 | 68.0 | 242 | |
| 32 | 69.5 | 170 | |
| 33 | 73.9 | 268 | |
| 34 | 75.9 | 269 | |
| Hydrocinnamic acid | 48.0 | 118 | |
| Cetyl alcohol | 49.3 | 141 | |
| α-Nepthylamine | 50.0 | 93 | |
| Camphene | 50 | 238 | |
| O-Nitroaniline | 50.0 | 93 | |
| 9-Heptadecanone | 51 | 213 | |
| Thymol | 51.5 | 115 | |
| Methyl behenate | 52 | 234 | |
| Diphenyl amine | 52.9 | 107 | |
| p-Dichlorobenzene | 53.1 | 121 | |
| Oxalate | 54.3 | 178 | |
| Hypophosphoric acid | 55 | 21 | |
| O-Xylene dichloride | 55.0 | 121 | |
| β-Chloroacetic acid | 56.0 | 147 | |
| Chloroacetic acid | 56 | 130 | |
| Nitro naphthalene | 56.7 | 103 | |
| Trimyristin | 33-57 | 201-213 | |
| Heptaudecanoic acid | 60.6 | 189 | |
| α-Chloroacetic acid | 61.2 | 130 | |
| Bees wax | 61.8 | 177 | |
| Glyolic acid | 63.0 | 109 | |
| p-Bromophenol | 63.5 | 86 | |
| Azobenzene | 67.1 | 121 | |
| Acrylic acid | 68.0 | 115 | |
| Dinto toluent (2, 4) | 70.0 | 111 | |
| $Na_2HPO_4 \cdot 12H_2O$ | 40.0 | 279 | |
| $CoSO_4 \cdot 7H_2O$ | 40.7 | 170 | |
| $KF \cdot 2H_2O$ | 42 | 162 | |
| $MgI_2 \cdot 8H_2O$ | 42 | 133 | |
| $CaI_2 \cdot 6H_2O$ | 42 | 162 | |
| $K_2HPO_4 \cdot 7H_2O$ | 45.0 | 145 | |
| $Zn(NO_3)_2 \cdot 4H_2O$ | 45 | 110 | |
| $Mg(NO_3) \cdot 4H_2O$ | 47.0 | 142 | |
| $Ca(NO_3) \cdot 4H_2O$ | 47.0 | 153 | |
| $Fe(NO_3)_3 \cdot 9H_2O$ | 47 | 155 | |
| $Na_2SiO_3 \cdot 4H_2O$ | 48 | 168 | |
| $K_2HPO_4 \cdot 3H_2O$ | 48 | 99 | |
| $Na_2S_2O_3 \cdot 5H_2O$ | 48.5 | 210 | |
| $MgSO_4 \cdot 7H_2O$ | 48.5 | 202 | |
| $Ca(NO_3)_2 \cdot 3H_2O$ | 51 | 104 | |
| $Zn(NO_3)_2 \cdot 2H_2O$ | 55 | 68 | |
| $FeCl_3 \cdot 2H_2O$ | 56 | 90 | |
| $Ni(NO_3)_2 \cdot 6H_2O$ | 57.0 | 169 | |
| $MnCl_2 \cdot 4H_2O$ | 58.0 | 151 | |
| $MgCl_2 \cdot 4H_2O$ | 58.0 | 178 | |

TABLE 2-continued

| Material | Melting Point $T_m$ (° C.) | Latent Heat of Fusion (kJ/kg) | Notes |
|---|---|---|---|
| $CH_3COONa \cdot 3H_2O$ | 58.0 | 265 | |
| $Fe(NO_3)_2 \cdot 6H_2O$ | 60.5 | 126 | |
| $NaAl(SO_4)_2 \cdot 10H_2O$ | 61.0 | 181 | |
| $NaOH \cdot H_2O$ | 64.3 | 273 | |
| $Na_3PO_4 \cdot 12H_2O$ | 65.0 | 190 | |
| $LiCH_3COO \cdot 2H_2O$ | 70 | 150 | |
| $Al(NO_3)_2 \cdot 9H_2O$ | 72 | 155 | |
| $Ba(OH)_2 \cdot 8H_2O$ | 78 | 265 | |
| Eladic acid | 47 | 218 | |
| Lauric acid | 49 | 178 | |
| Pentadecanoic acid | 52.5 | 178 | |
| Tristearin | 56 | 191 | |
| Myristic acid | 58 | 199 | |
| Palmatic acid | 55 | 163 | |
| Stearic acid | 69.4 | 199 | |
| Gallium-gallium antimony eutectic | 29.8 | --- | The dashes indicate the value is unknown to the inventors at this time |
| Gallium | 30.0 | 80.3 | |
| Cerrolow eutectic | 58 | 90.9 | |
| Bi—Cd—In eutectic | 61 | 25 | |
| Cerrobend eutectic | 70 | 32.6 | |
| Bi—Pb—In eutectic | 70 | 29 | |
| Bi—In eutectic | 72 | 25 | |
| Bi—Pb-tin eutectic | 96 | --- | The dashes indicate the value is unknown to the inventors at this time |
| Bi—Pb eutectic | 125 | --- | The dashes indicate the value is unknown to the inventors at this time |

To take advantage of the PCM pocket 175, it is necessary to provide a thermally conductive pathway between the component 110 and the PCM pocket(s) 175. This may be accomplished in a great variety of ways. For example, and as illustrated in this exemplary embodiment, the package substrate 160 may include vertically extending pins 177 and 178, which project down into the circuit board 105 and establish thermal contact with the PCM pocket(s) 175. There may be many more such pins that are not visible in FIG. 2 but used to provide a thermal pathway between the component 110 and the PCM pocket(s) 175. The pins 177 and 178 may be composed of well-known thermally conductive materials, such as copper, silver, platinum, gold, nickel, laminates or alloys of these, or other conductors. In this illustrative embodiment, the PCM pocket(s) 175 may have a generally sheet-like footprint. However, as described in more detail below, the PCM pocket(s) 175 used in the circuit board 105 may have other types of shapes as desired.

Figure 2:
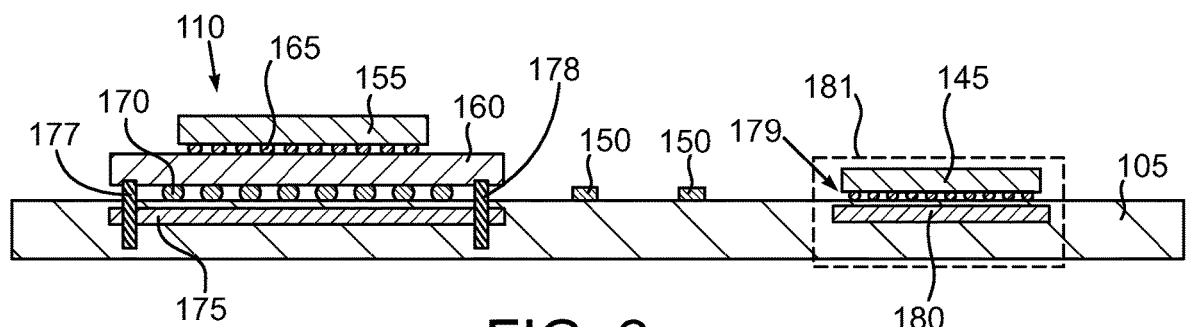
FIG. 2 is a sectional view of FIG. 1 taken at section 2-2.

The additional details of the component 145 will now be described in conjunction with FIGS. 1 and 2. The component 145 may be a chip scale package configuration as shown and interfaced electrically with the circuit board 105 by way of the ball grid array balls 179 shown as with any of the other components, other types of electrical interfaces may be used as well. Here, in lieu of the pins 177 and 178, the thermal pathway between the component 145 and a PCM pocket 180 positioned in the circuit board 105 may simply be provided by way of the BGA balls 179. Although not visible due to the scale of FIG. 2, the BGA 179 will establish metallurgical connections with ball pads or other types of electrically conductive surfaces of the circuit board 105 and these ball-to-pad pathways may be used to provide the requisite thermal conductivity between the component 145 and the PCM pocket 180. Still further details of the component 145 and the PCM pocket 180 may be understood by referring now also to FIG. 3, which is the portion of FIG. 2 circumscribed by the dashed rectangle 181 in FIG. 2 shown at greater magnification. Here, the aforementioned conductor pads, three of which are labeled 185a, 185b and 185c, are shown in ohmic contact with corresponding of the BGA balls 179. Various options are available. For example, the pad 185a associated with its corresponding ball may be configured as a dummy pad and used principally as a thermal pathway between the component 145 and the underlying PCM pocket 180. However, the pads 185b and 185c and others may be electrically active. Optionally, conductive pathways from the pads 185a, 185b and 185c into the circuit board may be routed around the PCM pocket 200. Conductive heat transfer is facilitated since the PCM pocket 180 is in contact with one or more surfaces of the circuit board 105.

Figure 4:
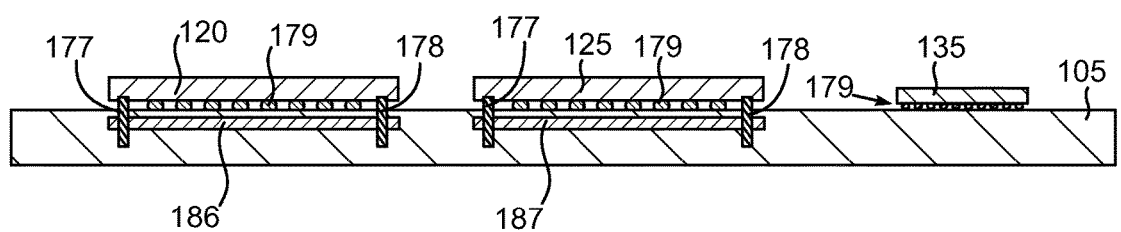
FIG. 4 is a sectional view of FIG. 1 taken at section 4-4.

Some additional details of the circuit board 105 may be understood by referring now to FIG. 4, which is a sectional view of FIG. 1 taken at section 4-4. Note that due to the location of section 4-4, the components 120, 125 and 135 will be shown in section. Here, the components 120, 125 and 135 may be chip scale package devices connected to the circuit board 105 by way of respective BGAs 179. The circuit board 105 may be a multi-layered structure consisting of multiple layers 182a, 182b, 182c, 182d and 182e. The number and types of layers 182a, 182b, 182c, 182d and 182e is subject to great variation. For example, the layer 182b may be configured as a core layer that provides strength while the layers 182a and 182c, 182d and 182e may be interconnect layers. Many different types of configurations are possible. In this illustrative embodiment, the top most layer 182e is populated with the aforementioned conductor pads, three of which are labeled 183a, 183b and 183c. Here, the conductor pads 183b and 183c may electrically interface with other conductor structures for example the conductor traces in the interconnect layer 182c by way of conductive vias 184b and 184c. The PCM pocket 180 is positioned in an internal space in the layer 182d. The internal space will be numbered and shown in greater detail in subsequent figures. If the PCM pocket 180 is composed of an electrically conducting material, then the layer 182d may be patterned such that a given conductive via such as the via 183c may be surrounded by a portion of the layer 182d as shown. Furthermore, it may be easier from a manufacturing standpoint to provide such conducting islands around a given conductive via in order to facilitate a plating or other type of process to establish the conducting via. The various layers 182a, 182b, 182c, 182d and 182e may be composed of various well-known epoxies with or without strengthening fillers such as glass fibers and others. In addition, the layers 182a, 182b, 182c, 182d and 182e may be composed of so called pre-preg layers that are stacked together and then heated to construct a solid substrate. Various other materials such as B-stage epoxies and others may be used as well. The components 120 and 125 may dissipate high enough levels of heat that it is advisable to position PCM pockets 186 and 187 in the circuit board 105 beneath the positions of the components 120 and 125. The aforementioned pins 177 and 178 may be used to establish a thermal pathway between the components 120 and 125 and the PCM pockets 186 and 187, respectively. However, the component 135 may be small enough or of sufficiently low power that it is not necessary to position a PCM pocket in the circuit board beneath it as shown.

Figure 5:
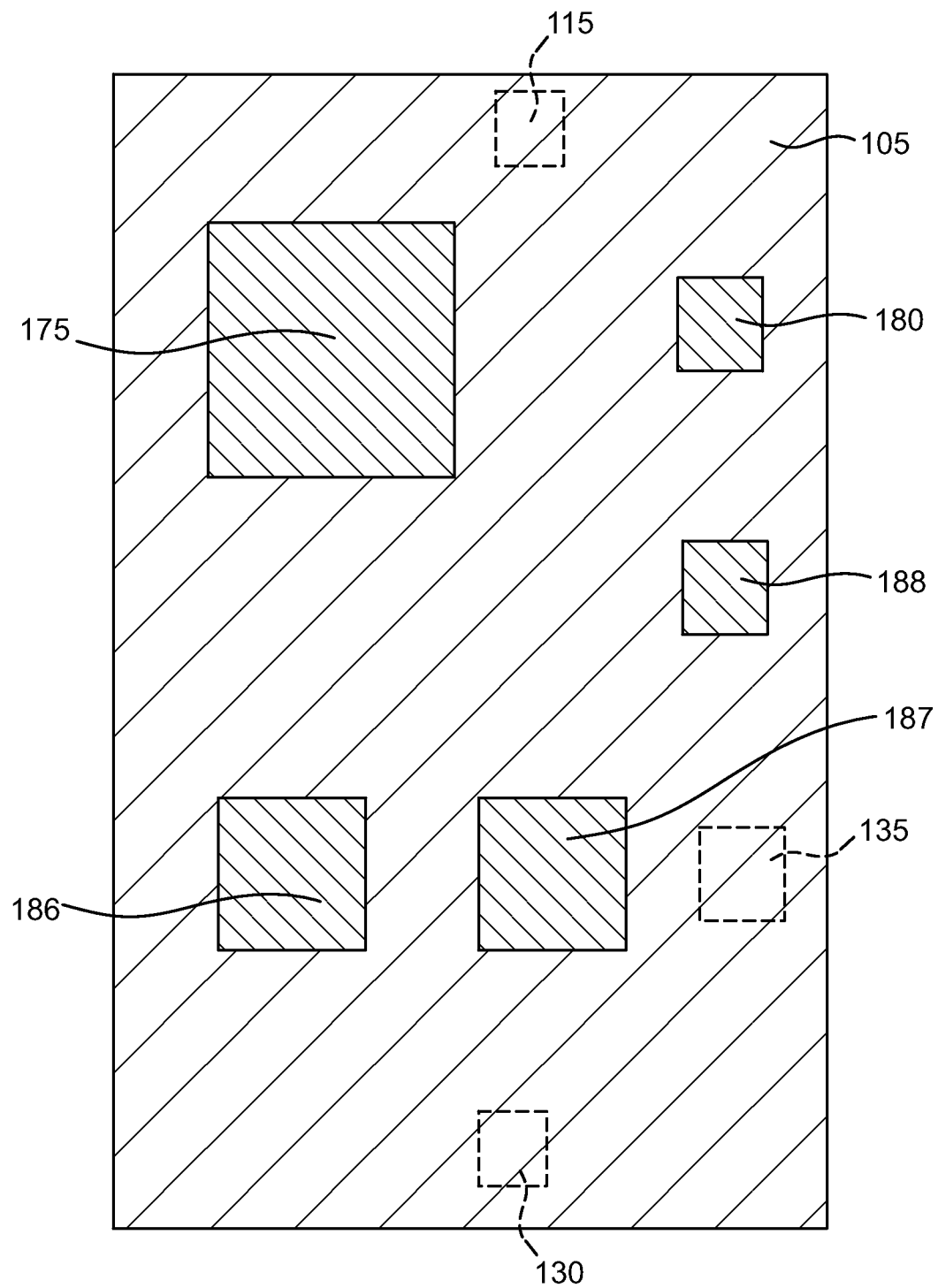
FIG. 5 is a sectional view of FIG. 1 taken at section 5-5.

As just noted, PCM pockets may be placed in the circuit board 105 at locations where it is advantageous to provide additional thermal management for various components. In this regard, attention is now turned to FIG. 5, which is a sectional view of FIG. 1 taken at section 5-5. Note that section 5-5 shows the circuit board 105 in section but viewed from below. Here, the components 115, 130 and 135 are obscured and thus shown in phantom. In addition, the components 115, 130 and 135 may not need PCM material and thus no PCM material pockets are provided in the circuit board 105 at their locations. The aforementioned PCM pockets 186 and 187 and an additional PCM pocket 188 are visible. The PCM pocket 188 may be positioned beneath the component 140 shown in FIG. 1. Here the PCM pockets 175, 180, 186, 187 and 188 have generally rectangular footprints, but other shapes are possible.

Figure 6:
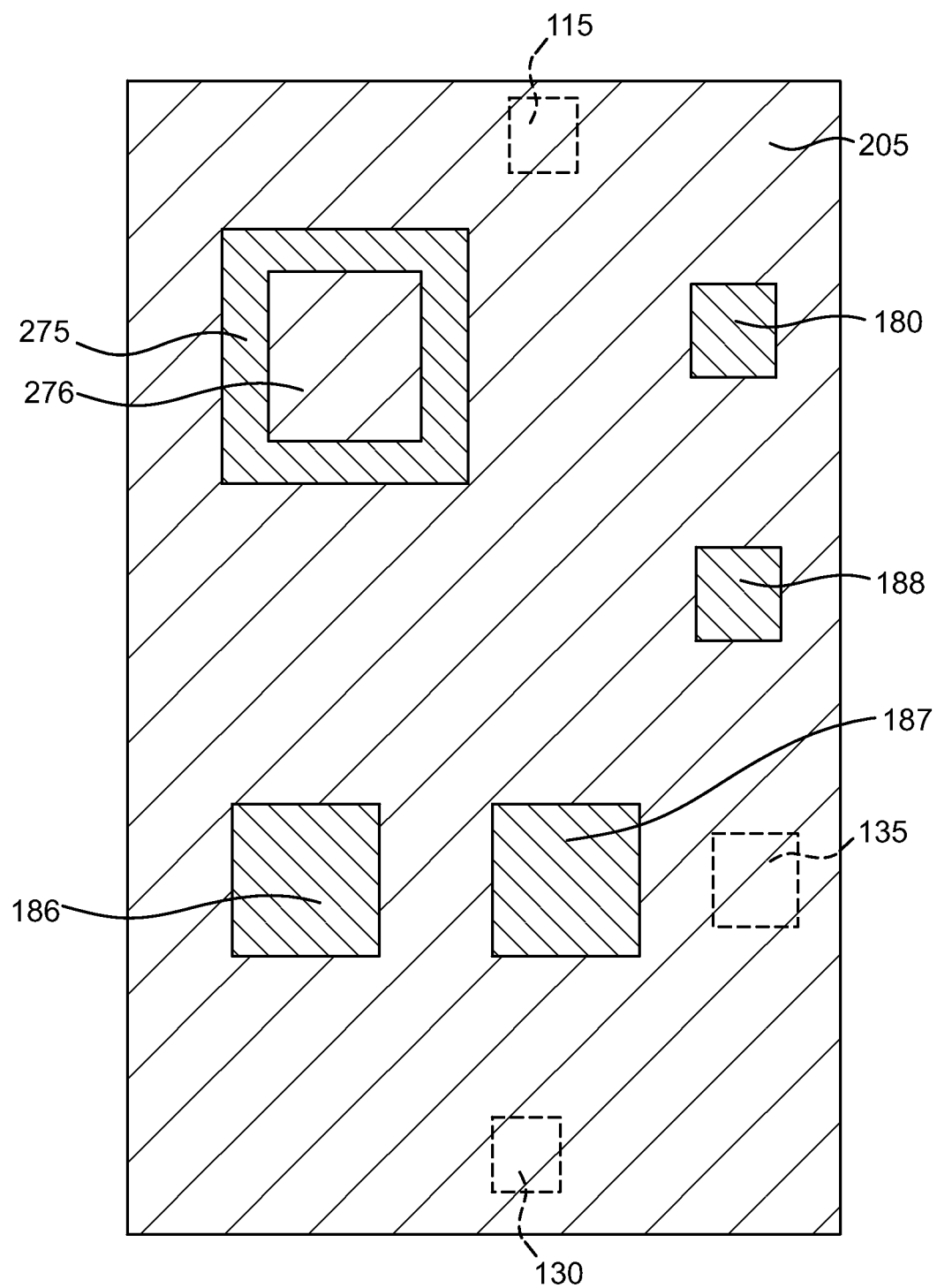
FIG. 6 is a sectional view like FIG. 5 but of an alternate exemplary embodiment of a circuit board.

As noted above, the PCM pockets may have a variety of footprints. In this regard, attention is now turned to FIG. 6, which is a sectional view like FIG. 5 but of an alternate exemplary circuit board 205 that may include the aforementioned PCM pockets 180, 186, 187 and 188. Again, the components 115, 130 and 135 may be mounted without any PCM pockets and thus are shown in phantom. In the embodiment depicted in FIG. 5, the PCM pocket 175 is sheet structure. However, in the illustrative embodiment depicted in FIG. 6, the PCM pocket 275 is a frame-like structure so that an internal portion 276 of the circuit board 205 inside the frame-like PCM pocket 275 is available for electrical routing. Again, thermal contact between a component and the PCM pocket 275 may be by any of the alternatives disclosed herein.

Figure 7:
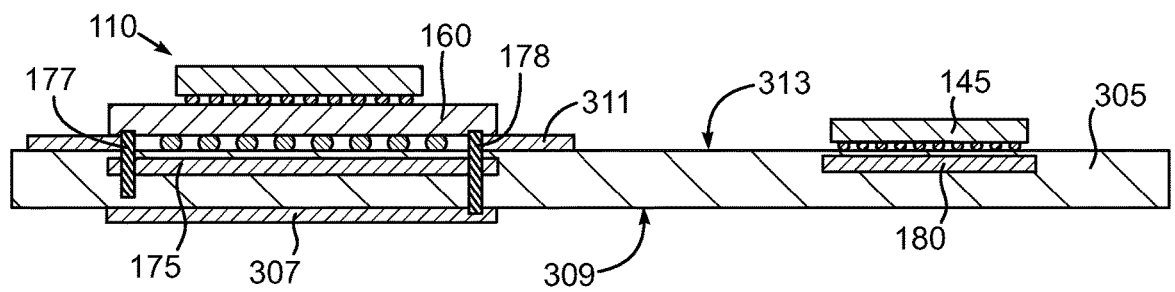
FIG. 7 is a sectional view like FIG. 2 but of an alternate exemplary circuit board.

Attention is now turned to FIG. 7, which is a sectional view like FIG. 2 but of an alternate exemplary circuit board 305 that will be used to illustrate various alternative usages and placements of PCM pockets. Here, the component 110 may be mounted to the circuit board 305 as generally described above with a few notable exceptions. The aforementioned PCM pocket 175 may be positioned in the circuit board 305 as generally described above in conjunction with the circuit board 105. However, a PCM pocket 307 may be mounted on an underside 309 of the circuit board 305 and in thermal contact with the component 110 by way of the pin 178 which extends from the component 110 down through the circuit board 305 and makes thermal contact with the PCM pocket 307 as well as the PCM pocket 175. In addition, a frame-like PCM pocket 311 may be positioned on an upper side 313 of the circuit board 305. The PCM pocket 311 may be in thermal contact with the component 110 by way of the pins 177 and 178 as well as by thermally conductive contact with the package substrate 160 as well. These externally-mounted PCM pockets 307 and 311 will include a container to hold a volume of PCM, but the scale of FIG. 7 is such that these containers are not visible. Again, it should be understood that the PCM pockets 175, 307 and 311 may be configured and used in a variety of ways. The component 145 may be positioned above the PCM pocket 180 as described above.

Figure 8:
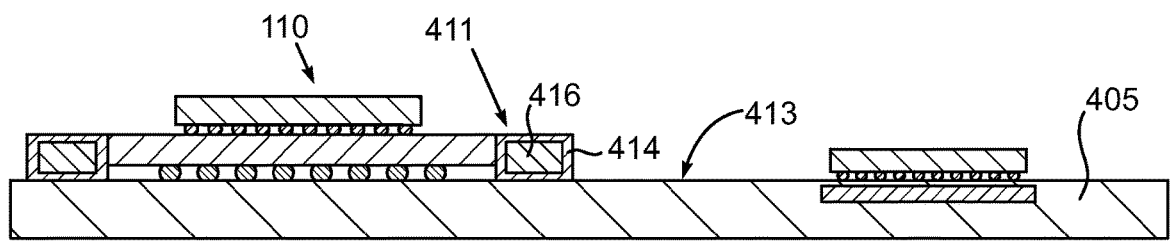
FIG. 8 is a sectional view like FIG. 7 but of another alternate exemplary circuit board.

FIG. 8 is a sectional view like FIG. 7 but of yet another alternative embodiment of a circuit board 405. In this illustrative embodiment, the component 110 may be mounted to the circuit board 405 as generally described above in conjunction with the circuit board 105. However, a PCM pocket 411 may be seated on an upper surface 413 of the circuit board 405 and configured as a frame structure that surrounds the component 110 and in particular establishes thermal contact with the package substrate 160 thereof. The PCM pocket 411 will consist of a shell 414 that encloses a volume of PCM 416.

Figure 3:
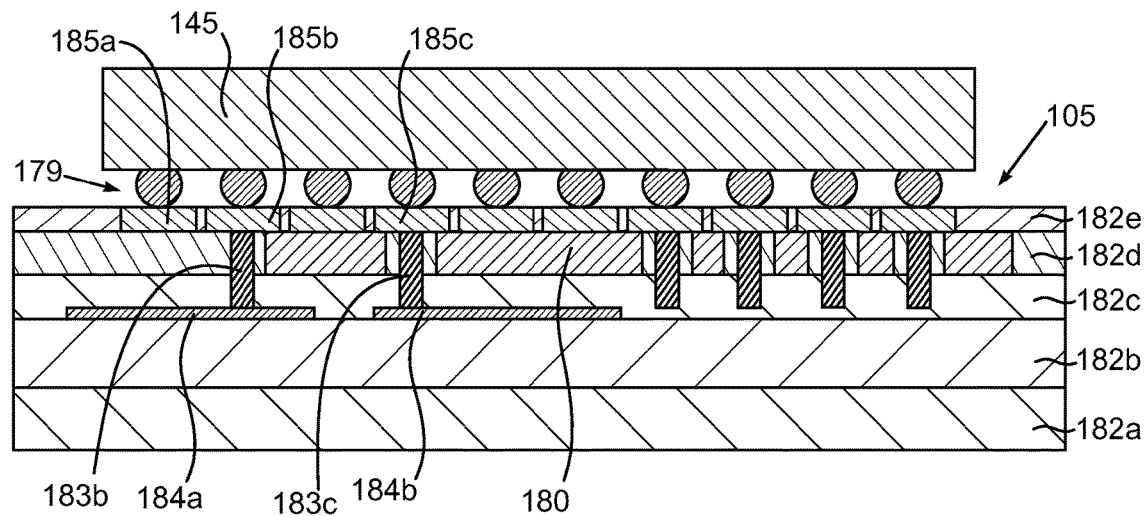
FIG. 3 is a portion of FIG. 2 shown at greater magnification.
Figure 9:
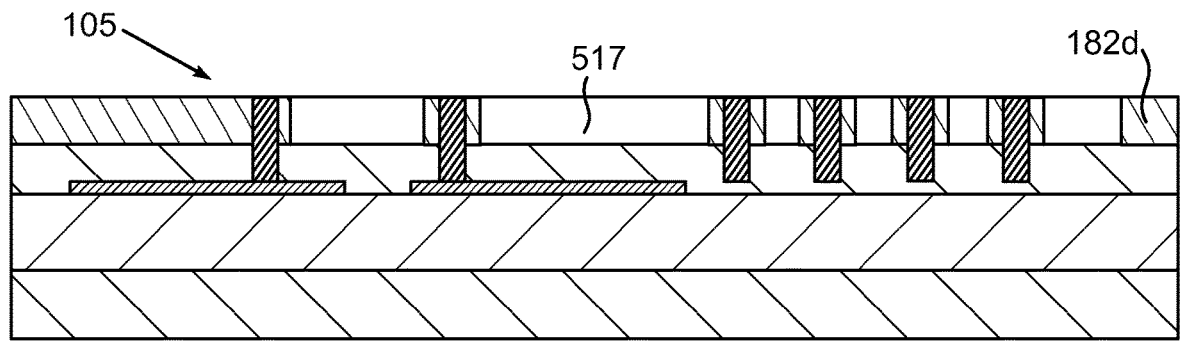
FIG. 9 is a sectional view of FIG. 3 but depicting an initial processing to establish a circuit board internal space.
Figure 10:
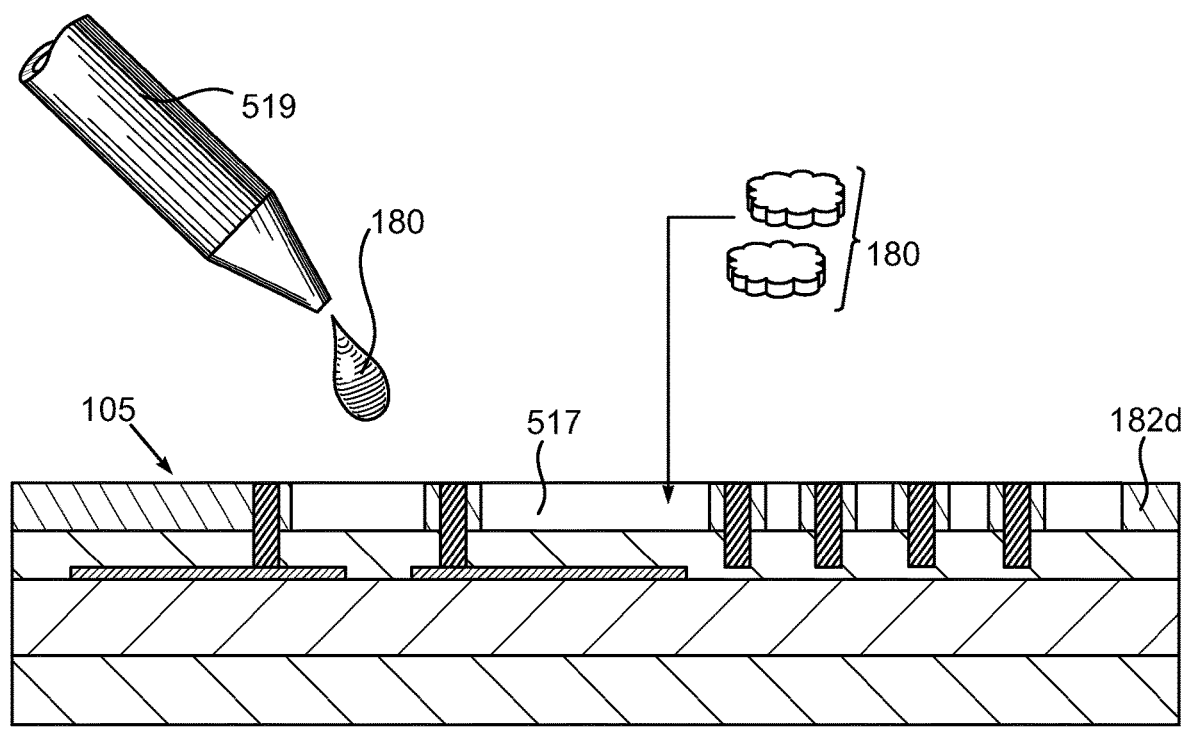
FIG. 10 is a sectional view like FIG. 9 but depicting application of a phase change material.
Figure 11:
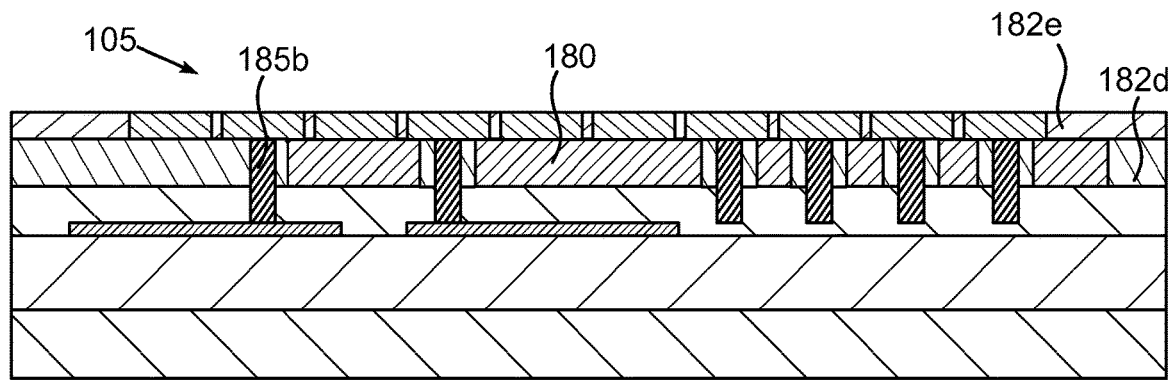
FIG. 11 is a sectional view like FIG. 10 but depicting fabrication of one or more additional layers on the circuit board.
Figure 12:
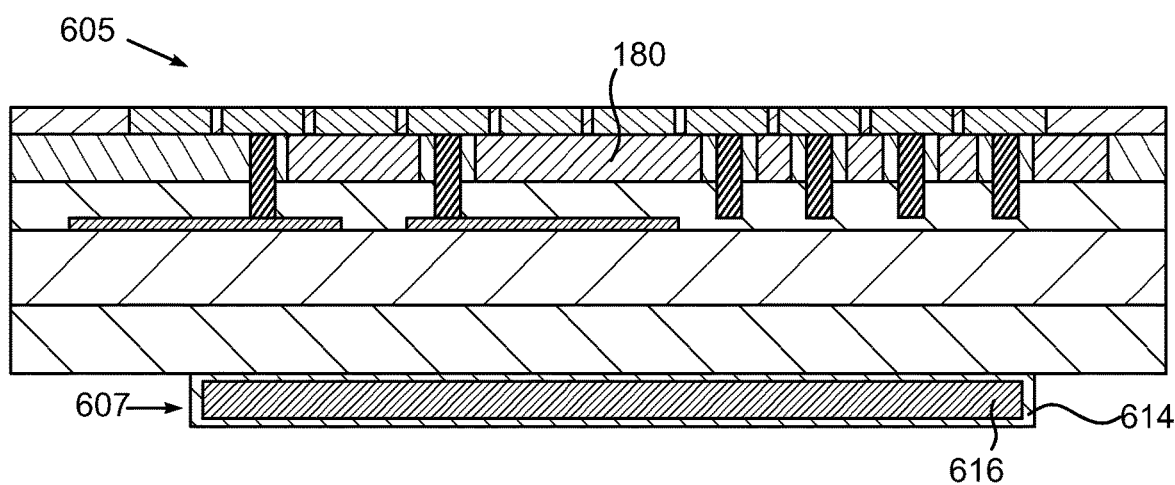
FIG. 12 is a sectional view like FIG. 11 but depicting application of an alternate exemplary phase change material pocket to a circuit board.

An exemplary method for fitting a circuit board with one or more PCM pockets may be understood by referring now to FIGS. 9, 10 and 11 and initially to FIG. 9, which is a sectional view like FIG. 3 but at an earlier stage of processing. Up to this point, well known techniques may be used to fabricate or otherwise join the interconnect layers 182a, 182b, 182c and 182d. Furthermore, well known interconnect fabrication techniques may be used to establish the conductor traces 184a and 184b as well as the conductive vias 183b and 183c, etc. To hold the later applied or otherwise formed PCM pocket, an internal space 517 is formed in the interconnect layer 182d. The internal space 517 may be formed in a variety of ways depending upon how the interconnect layer 182d is formed. For example, if the interconnect layer 182d is a pre-preg layer then the internal space 517 may be pre-patterned into the pre-preg layer prior to application to the interconnect layer 182c. However, if the interconnect layer 182d is a build up layer formed from an epoxy rosin that is subsequently hardened, then the internal space 517 may be laser cut or chemically etched as desired. It may also be possible to establish the internal space 517 by way of an additive process such as lift off type process. Next and as shown in FIG. 10, the PCM 180 may be applied into the internal space 517 by a suitable applicator 519. Optionally, the PCM 180 may be applied as pre-forms that are placed in the internal space 517. At this stage, the circuit board 105 is ready to have another interconnect layer placed or otherwise formed on the interconnect layer 182d.

As shown in FIG. 11, the interconnect layer 182e may be applied or otherwise formed on the interconnect layer 182d and the conductor pads, one of which is labeled 185b may be formed using well known conductor pad fabrication techniques. At this stage, the PCM pocket 180 is enclosed and ready to provide thermal management. The circuit board 105 may be subsequently processed to mount the component 145 shown in FIG. 3 as well as any of the other components shown in FIGS. 1 and 2.

As noted briefly above, a PCM pocket may be mounted in a variety of locations relative to a circuit board. For example, an exemplary circuit board 605 which may be substantially identical to the circuit board 105 depicted in FIG. 11 may be fitted with a back side PCM pocket 607 that consists of an enclosure 614 that holds a volume of PCM 616. In addition, the circuit board 605 may include the aforementioned front side PCM pocket 180 as described above.

Figure 13:
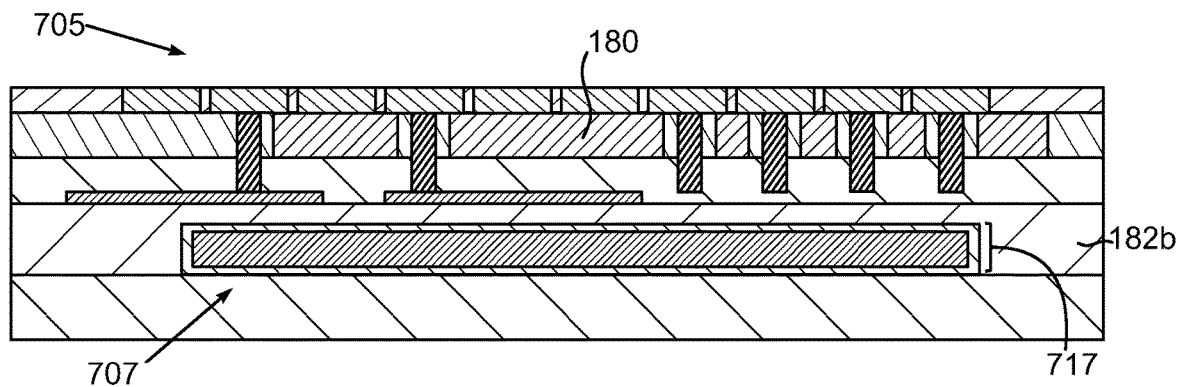
FIG. 13 is a sectional view like FIG. 12 but depicting another alternate exemplary application of a phase change material pocket to a circuit board.

In another alternative embodiment depicted in FIG. 13, a circuit board 705 may include the aforementioned front side PCM pocket 180. However, in this illustrative embodiment, a PCM pocket 707 may be embedded within one of the interconnect layers such as the interconnect layer 182b of the circuit board 705. This may be accomplished by, for example, forming an internal space 717 in the interconnect layer 182b. Again, the material point here is to illustrate that a PCM may be positioned in a variety of locations in or on a circuit board.

Figure 14:
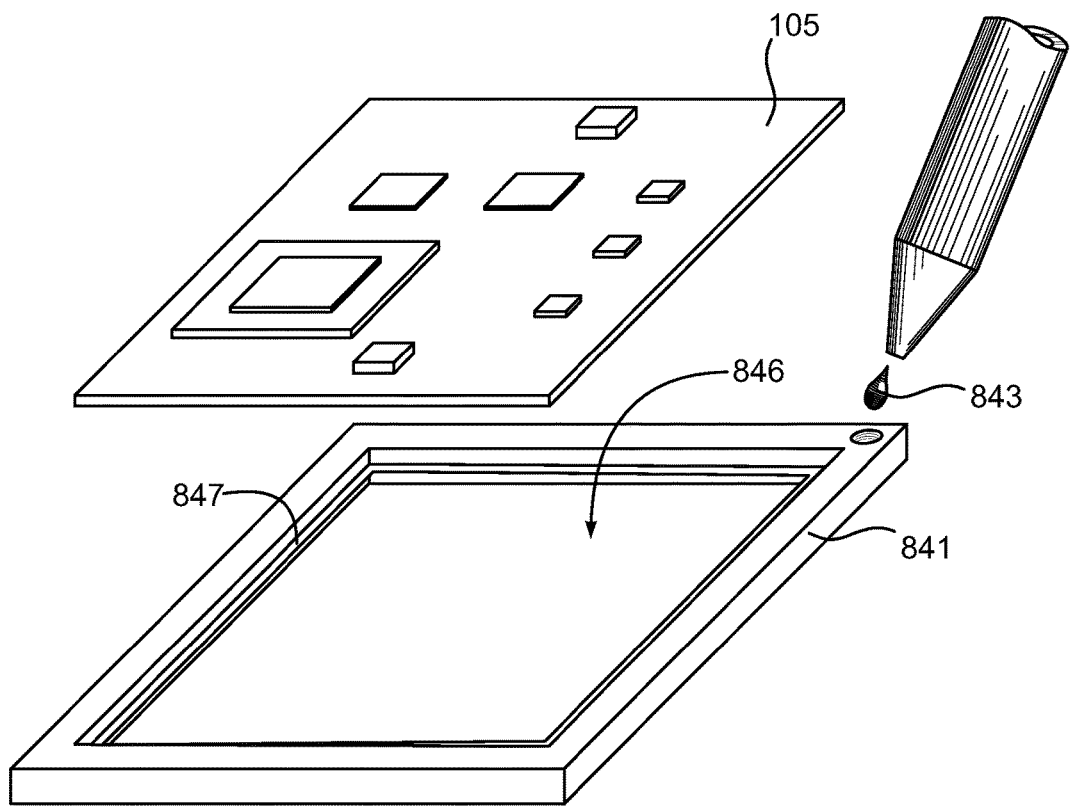
FIG. 14 is a pictorial view depicting another alternate exemplary phase change material pocket.

In still another alternative embodiment, it may be possible to place PCM in an external frame that is designed to fit around the perimeter of an entire circuit board. This may be useful in circumstances where it is not practical to reroute internal traces and other conductors in a circuit board in order to accommodate internally mounted PCM pockets. As shown in FIG. 14, a suitable frame member 841 may be filled with a PCM 843. The frame 841 may have a footprint with an internal opening 846 that is large enough to accommodate the circuit board 105. A seating shelf 847 may be positioned in the opening to allow the circuit board to be seated thereon such that the circuit board 105 is on the frame member 841 and vice versa. The opening 846 is advantageously just slightly larger than the circuit board 105 so that good thermal contact is established between the frame 841 and the circuit board 105. The frame 841 may be fabricated from a variety of materials such as plastics, metals, etc.

Figure 15:
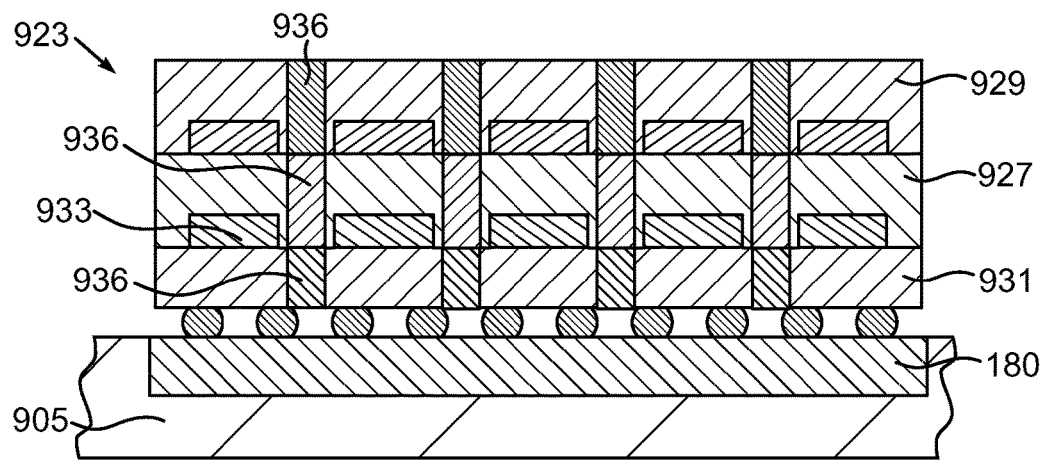
FIG. 15 is a sectional view of an exemplary semiconductor chip incorporating phase change material pockets mounted on a circuit board incorporating a phase change material pocket.

As shown in FIG. 15, which is a sectional view of a small portion of a circuit board 905, the usage of a PCM pocket 180 may be extended to not only the circuit board 905 but also to a semiconductor chip device that is mounted thereon. In this regard, a chip device 923 may be mounted on the circuit board 905 and in thermal contact with a PCM pocket 926 in the circuit board 905. The semiconductor chip device 923 may include one or more semiconductor chips 927 and 929 mounted on a substrate 931, which may be an interposer or a circuit board. Each of the semiconductor chips 927 and 929 may be supplied with one or more PCM pockets 933. Thru-silicon-vias 936 may be used for through chip routing of power, ground and signals. The terms "thru-silicon" are not intended to exclude chip materials other than silicon.

Figure 16:
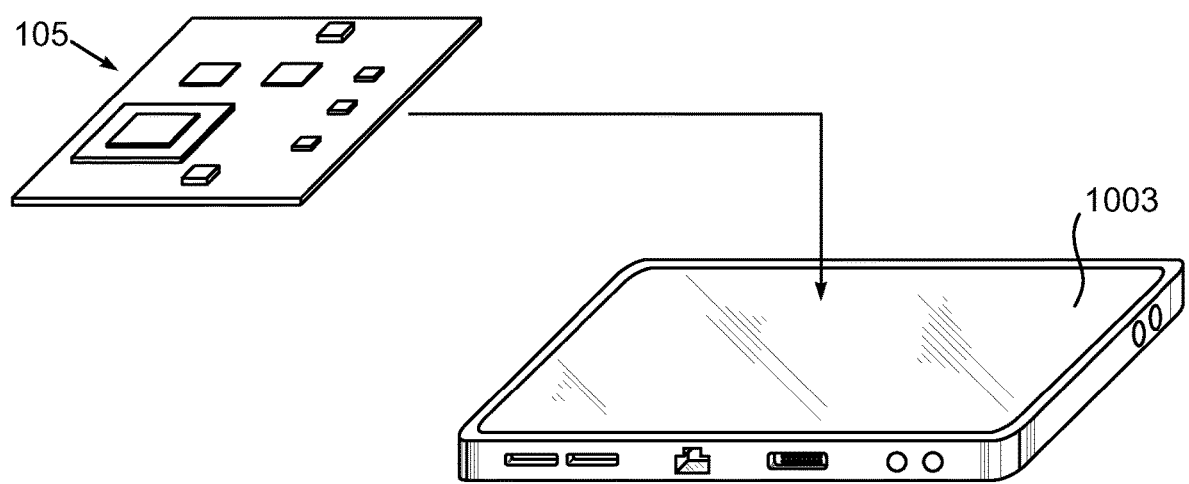
FIG. 16 is a pictorial view of a circuit board 105 exploded from an electronic device.

Any of the illustrative embodiments of a circuit board 105, 205, 305, 405, 505, 605, 705, 805 or 905 may be mounted in an electronic device. For example, and as shown in FIG. 16, the circuit board 105 may be mounted into an electronic device 1003. The electronic device 1003 may be a computer, a digital television, a handheld mobile device, a personal computer, a server, a memory device, an add-in board such as a graphics card, or any other computing device employing semiconductors.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a circuit board having a first means for holding a phase change material; and
   plural pins projecting into the circuit board to make thermal contact with the first means for holding the phase change material and projecting out of the circuit board to make thermal contact with a component configured to be mounted on the circuit board.

2. The apparatus of claim 1, wherein the first means for holding the phase change material comprises an internal space of the circuit board holding the phase change material.

3. The apparatus of claim 1, wherein the first means for holding the phase change material comprises a shell coupled to an exterior of the circuit board.

4. The apparatus of claim 3, wherein the circuit board comprises the component mounted on the exterior, the shell comprising a frame positioned around the component.

5. The apparatus of claim 1, wherein the circuit board comprises an exterior and the component mounted on the exterior, the first means for holding the phase change material being positioned beneath the component.

6. The apparatus of claim 1, wherein the circuit board comprises a second means for holding a phase change material.

7. The apparatus of claim 1, comprising a semiconductor chip mounted on the circuit board and having a phase change material pocket.

8. The apparatus of claim 1, comprising an electronic device coupled to the circuit board.

9. A method of manufacturing, comprising:
   providing a circuit board;
   forming an internal space in the circuit board; and
   after forming the internal space positioning a phase change material in the internal space to contact a surface of the circuit board.

10. The method of claim 9, positioning plural pins that project into the circuit board to make thermal contact with the phase change material and project out of the circuit board to make thermal contact with a component configured to be mounted on the circuit board.

11. The method of claim 9, comprising coupling a first phase change material pocket to a first exterior side of the circuit board.

12. The method of claim 11, coupling a second phase change material pocket to a second exterior side of the circuit board opposite to the first exterior side, the second phase changer material pocket comprising a frame configured to be positioned around a component configured to be mounted on the circuit board.

13. The method of claim 11, wherein the first phase change material pocket is positioned beneath the component.

14. The method of claim 9, comprising providing the circuit board with a means for holding a phase change material.

15. The method of claim 9, comprising mounting a semiconductor chip on the circuit board, the semiconductor chip having a phase change material pocket.

16. A method of providing thermal management for a component mounted on a circuit board, comprising:
   placing a first means for holding a phase change material in thermal contact with the circuit board; and
   using plural pins projecting into the circuit board to make thermal contact with the first means for holding a phase change material and projecting out of the circuit board to make thermal contact with the component.

17. The method of claim 16, wherein the first means for holding the phase change material is positioned in an internal space of the circuit board.

18. The method of claim 16, wherein the first means for holding the phase change material comprises a shell coupled to an exterior of the circuit board.

19. The method of claim 16, comprising providing the component with a second means for holding a phase change material.

* * * * *